(12) United States Patent
Koh et al.

(10) Patent No.: US 9,147,687 B2
(45) Date of Patent: Sep. 29, 2015

(54) METHODS OF FABRICATING SEMICONDUCTOR DEVICES

(71) Applicants: Cha-Won Koh, Yongin-si (KR); Hyun-Woo Kim, Seongnam-si (KR); Jeon-Il Lee, Suwon-si (KR); Hyo-Sung Lee, Suwon-si (KR)

(72) Inventors: Cha-Won Koh, Yongin-si (KR); Hyun-Woo Kim, Seongnam-si (KR); Jeon-Il Lee, Suwon-si (KR); Hyo-Sung Lee, Suwon-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 14/299,495

(22) Filed: Jun. 9, 2014

(65) Prior Publication Data

US 2015/0093897 A1 Apr. 2, 2015

(30) Foreign Application Priority Data

Oct. 2, 2013 (KR) .................. 10-2013-0117885

(51) Int. Cl.
*H01L 27/112* (2006.01)
*H01L 21/3065* (2006.01)
*H01L 21/283* (2006.01)

(52) U.S. Cl.
CPC ........ *H01L 27/11286* (2013.01); *H01L 21/283* (2013.01); *H01L 21/3065* (2013.01)

(58) Field of Classification Search
None
See application file for complete search history.

(56) References Cited

U.S. PATENT DOCUMENTS

| | | | |
|---|---|---|---|
| 7,252,777 | B2 | 8/2007 | Vidusek et al. |
| 7,615,807 | B2 | 11/2009 | Harter et al. |
| 8,293,641 | B2 | 10/2012 | Seidel et al. |
| 2010/0301449 | A1 | 12/2010 | Scheuerlein et al. |
| 2012/0286226 | A1 | 11/2012 | Seong et al. |
| 2013/0059425 | A1 | 3/2013 | Zhang |
| 2013/0087528 | A1 | 4/2013 | Zhu et al. |

FOREIGN PATENT DOCUMENTS

| | | |
|---|---|---|
| KR | 1020000056498 A | 9/2000 |
| KR | 1020070066428 A | 6/2007 |
| KR | 1020070081416 A | 8/2007 |
| KR | 1020070084768 A | 8/2007 |
| KR | 1020090032890 A | 4/2009 |
| KR | 1020090039145 A | 4/2009 |
| KR | 1020120049512 A | 5/2012 |
| KR | 1020120063962 A | 6/2012 |

*Primary Examiner* — Scott B Geyer
(74) *Attorney, Agent, or Firm* — Myers Bigel Sibley & Sajovec, P.A.

(57) ABSTRACT

Semiconductor devices and methods of fabricating the same are provided. The methods include preparing a template having a three dimensional (3D) stair type structure formed in intaglio, forming an imprint pattern having the stair type structure using the template, and simultaneously forming stair type patterns on a substrate using the imprint pattern.

20 Claims, 22 Drawing Sheets

METHODS OF FABRICATING SEMICONDUCTOR DEVICES

CROSS-REFERENCE TO RELATED APPLICATION

This application claims priority from Korean Patent Application No. 10-2013-0117885 filed on Oct. 2, 2013 in the Korean Intellectual Property Office, and all the benefits accruing therefrom under 35 U.S.C. §119, the contents of which in its entirety are herein incorporated by reference.

FIELD

The present inventive concept relates to methods of fabricating semiconductor devices.

BACKGROUND

In order to increase an integration level of arrays, a NAND flash memory device may include a predetermined number of NAND type memory cells. The number of contacts provided in a cell array of a NAND flash memory device is less than the number of contacts in a cell array of a NOR flash memory device. Thus, the NAND flash memory device may have a relatively small chip size. Therefore, according to the trend toward high integration and large capacity of a semiconductor memory device, the demand for NAND flash memory devices is on the rise.

The cell arrays provided in a NAND flash memory device are formed in a single layer on a semiconductor substrate. However, to cope with the trend toward high integration and large capacity of a semiconductor memory device, the sizes of cell arrays to be implemented on a plane of the single layer may be reduced while the number of cell arrays is gradually increased. According to the development of a highly integrated, large capacity NAND flash memory device, the NAND flash memory device may have vertical type cell arrays.

SUMMARY

Embodiments of the present inventive concept provide methods of fabricating semiconductor devices, which can reduce the fabrication cost while making an overlay distribution and a critical dimension (CD) distribution uniform in forming a plurality of gate pads having vertically aligned gate patterns.

The above and other objects of the present inventive concept will be described in or be apparent from the following description of the preferred embodiments.

According to some embodiments of the present inventive concept, a method of fabricating a semiconductor device includes preparing a template having a three dimensional (3D) stair type structure formed in intaglio, forming an imprint pattern having the stair type structure using the template, and simultaneously forming a stair type pattern on a substrate using the imprint pattern.

According to some embodiments of the present inventive concept, a method of fabricating a semiconductor device includes preparing a template having a three dimensional (3D) stair type structure formed in intaglio, the stair type structure including first to nth layers, forming an imprint pattern having the stair type structure using the template, forming the first layer on the substrate using the imprint pattern as a mask, forming the second layer on the substrate using the imprint pattern as a mask after removing the first layer of the imprint pattern, and sequentially forming the third to nth layers on the substrate by sequentially removing the second to nth layers of the imprint pattern using the imprint pattern as a mask.

According to some embodiments of the present inventive concept, a method of fabricating a semiconductor device may include forming an imprint pattern having a three dimensional (3D) stair type structure using a template that mirrors the 3D stair type structure. The 3D stair type structure may include at least three stairs of similar height and width. The method may also include forming a stair type pattern on a substrate using the imprint pattern. Each of the at least three stairs of the stair type pattern is formed simultaneously.

BRIEF DESCRIPTION OF THE DRAWINGS

The above and other features and advantages of the present inventive concept will become more apparent by describing in detail preferred embodiments thereof with reference to the attached drawings in which.

DETAILED DESCRIPTION

Figure 1:
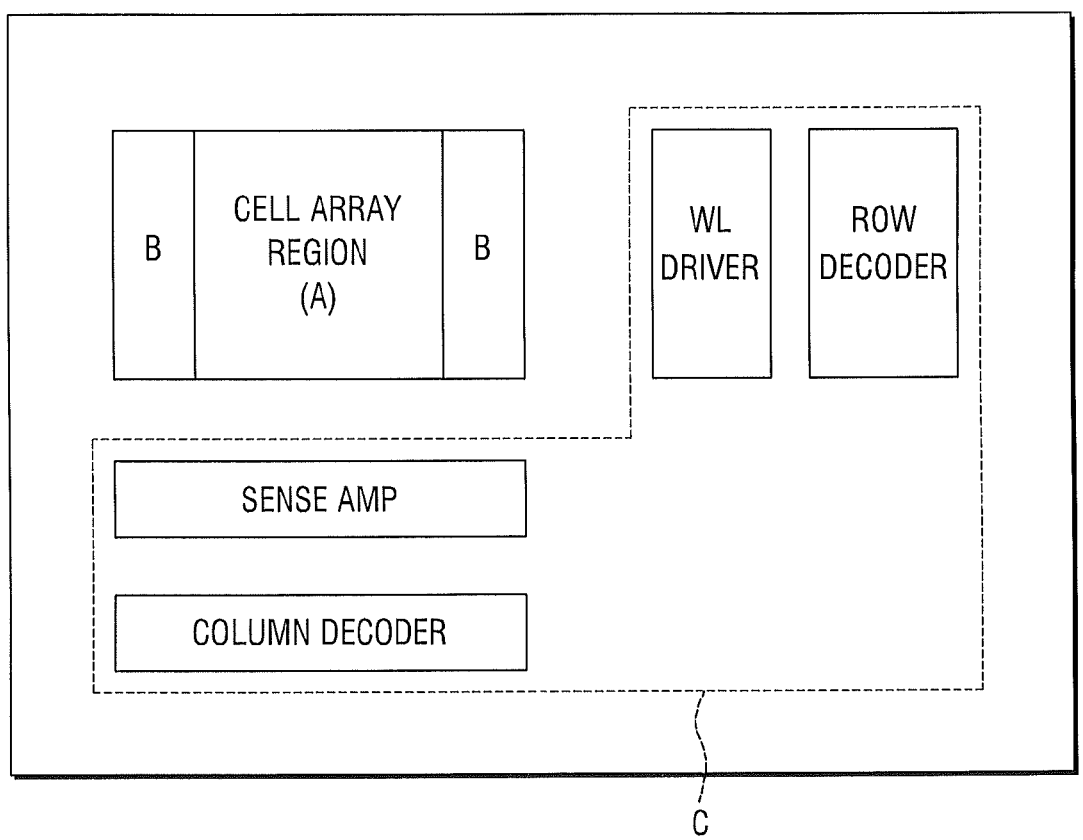
FIG. 1 is a schematic block diagram of a 3D semiconductor memory device according to an embodiment of the present inventive concept.

The present invention will now be described more fully hereinafter with reference to the accompanying drawings, in which preferred embodiments of the invention are shown. This invention may, however, be embodied in different forms and should not be construed as limited to the embodiments set forth herein. Rather, these embodiments are provided so that this disclosure will be thorough and complete, and will fully convey the scope of the invention to those skilled in the art. The same reference numbers indicate the same components throughout the specification. In the attached figures, the thickness of layers and regions is exaggerated for clarity.

It will also be understood that when a layer is referred to as being "on" another layer or substrate, it can be directly on the other layer or substrate, or intervening layers may also be present. In contrast, when an element is referred to as being "directly on" another element, there are no intervening elements present.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The use of the terms "a" and "an" and "the" and similar referents in the context of describing the invention (especially in the context of the following claims) are to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted.

Unless defined otherwise, all technical and scientific terms used herein have the same meaning as commonly understood by one of ordinary skill in the art to which this invention belongs. It is noted that the use of any and all examples, or exemplary terms provided herein is intended merely to better illuminate the invention and is not a limitation on the scope of the invention unless otherwise specified. Further, unless defined otherwise, all terms defined in generally used dictionaries may not be overly interpreted.

The present invention will be described with reference to perspective views, cross-sectional views, and/or plan views, in which preferred embodiments of the invention are shown. Thus, the profile of an exemplary view may be modified according to manufacturing techniques and/or allowances. That is, the embodiments of the invention are not intended to limit the scope of the present invention but cover all changes and modifications that can be caused due to a change in manufacturing process. Thus, regions shown in the drawings are illustrated in schematic form and the shapes of the regions are presented simply by way of illustration and not as a limitation.

A method of fabricating a semiconductor device to be described below is directed to a method for simultaneously forming a plurality of gate pads having a stair type structure using a nano-imprint lithography method or a method for reducing the fabrication cost of the semiconductor device by simplifying process steps. In order to form 24 step gate pads, it is necessary to perform a photolithography process 24 times. However, according to embodiments of the present inventive concept, a plurality of gate pads can be formed by performing an imprint process once, thereby reducing the fabrication time and cost by reducing the number of process steps. In addition, according to embodiments of the present inventive concept, an overlay between gate pads can be controlled to be uniform.

FIG. 1 is a schematic block diagram of a 3D semiconductor memory device according to an embodiment of the present inventive concept.

Referring to FIG. 1, the 3D semiconductor memory device according to an embodiment of the present inventive concept may include a cell array region A, a connection region B, and a peripheral circuit region C.

In the cell array region A, memory cells are arranged in a three-dimensional (3D) manner with bit lines and word line electrically connected to the memory cells. The connection region B may be disposed between the cell array region A and the peripheral circuit region C. In the connection region B, contact plugs and interconnections connecting the memory cells and peripheral circuits may be formed. In the peripheral circuit region C, peripheral circuits for driving the memory cells and determining data stored in the memory cells may be formed. In detail, a word line (WL) driver, a sense amplifier, a row decoder, a column decoder, and control circuits may be formed in the peripheral circuit region C.

Figure 2:
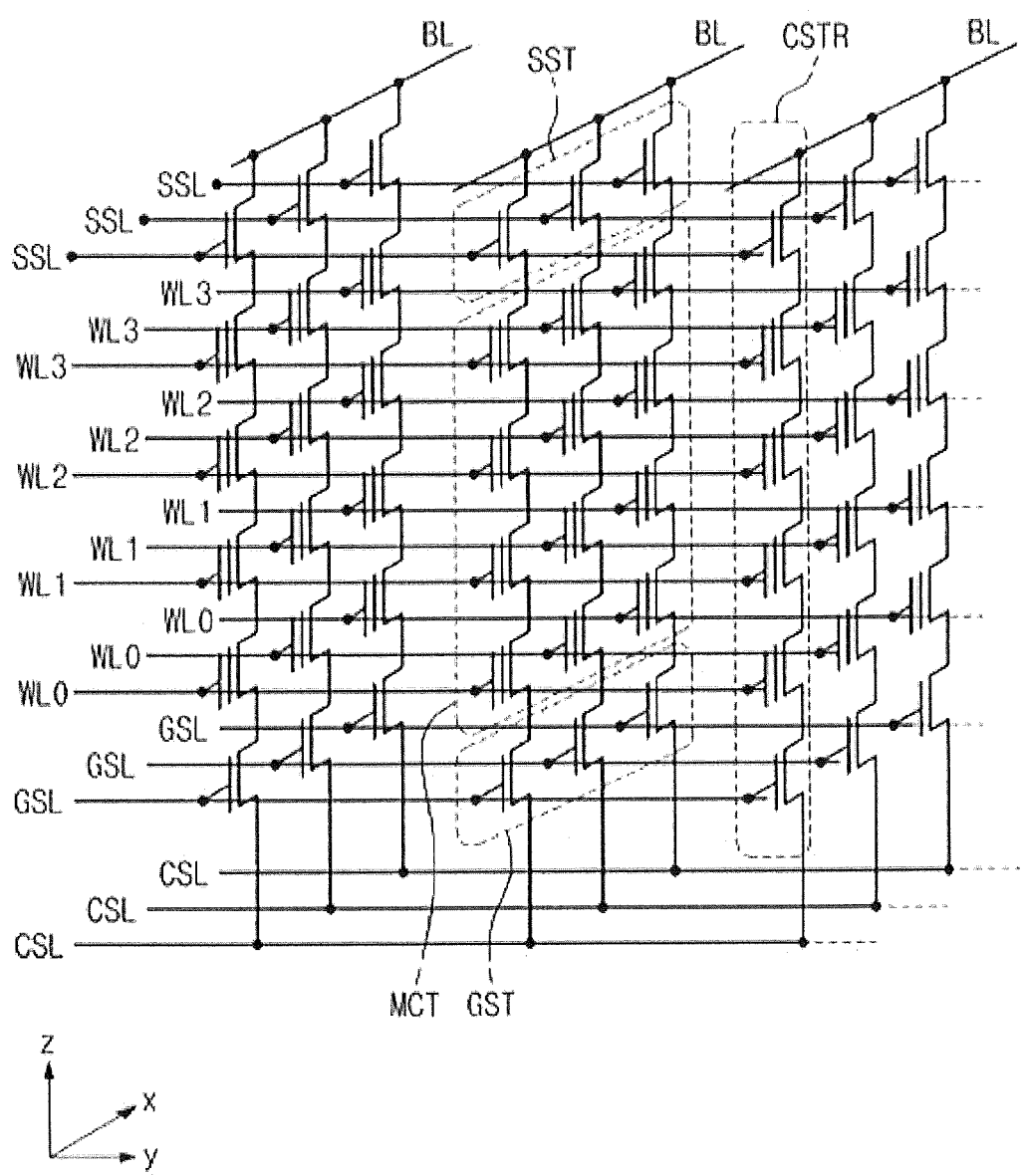
FIG. 2 is a circuit view briefly illustrating a cell array of the 3D semiconductor memory device shown in FIG. 1.
Figure 3:
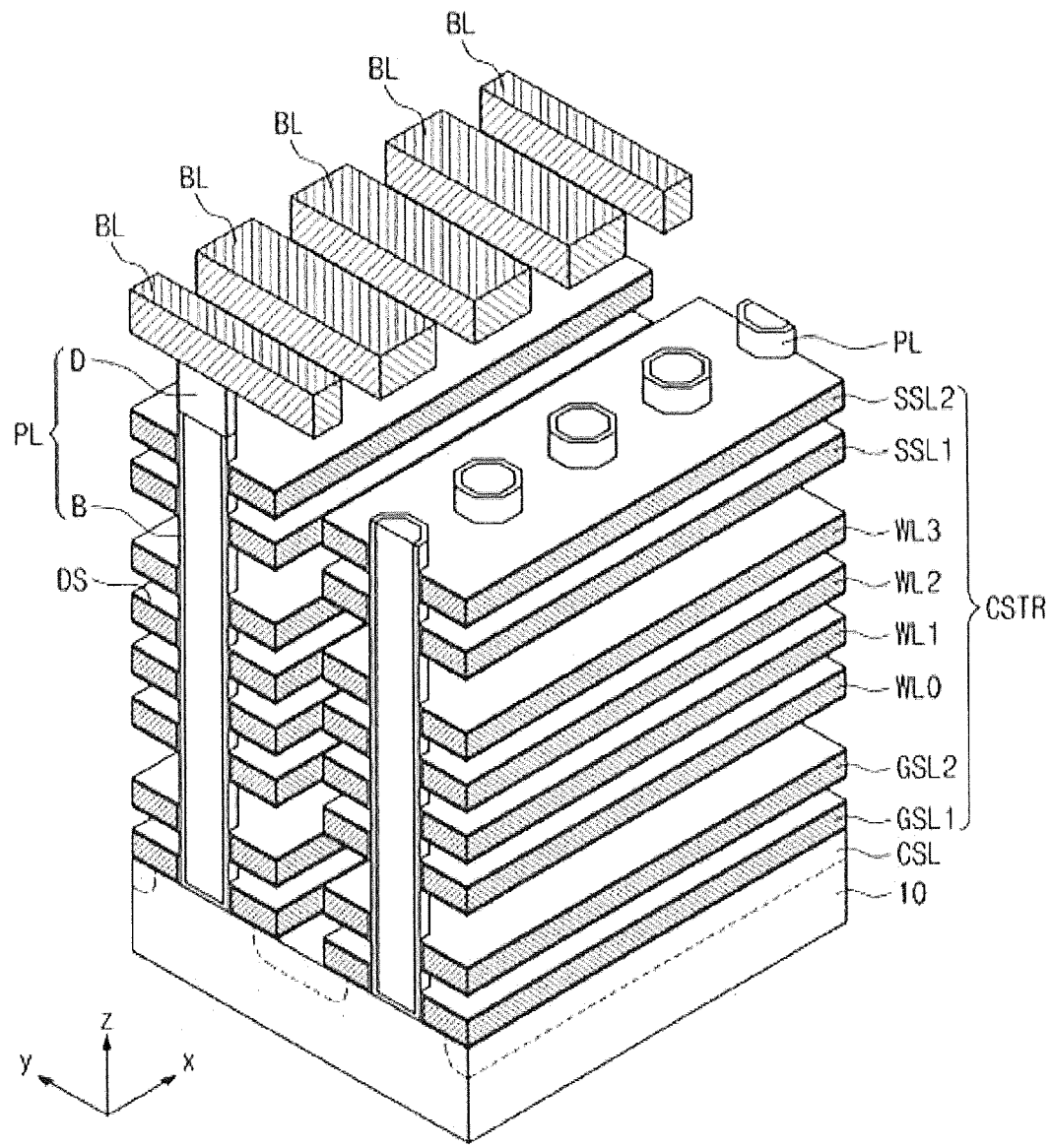
FIG. 3 is a perspective view illustrating the cell array of the 3D semiconductor memory device shown in FIG. 2.

FIG. 2 is a circuit view briefly illustrating a cell array of the 3D semiconductor memory device shown in FIG. 1 and FIG. 3 is a perspective view illustrating the cell array of the 3D semiconductor memory device shown in FIG. 2.

Referring to FIG. 2, the cell array of the 3D semiconductor memory device according to an embodiment of the present inventive concept may include a common source line CSL, a plurality of bit lines BLs, and a plurality of cell strings CSTRs disposed between the common source line CSL and the plurality of bit lines BLs.

The plurality of bit lines BLs are arranged in a two-dimensional (2D) manner, and the plurality of cell strings CSTRs are connected in parallel to the plurality of bit lines BLs, respectively. The plurality of cell strings CSTRs may be commonly connected to the common source line CSL. That is to say, the plurality of cell strings CSTRs may be disposed between the plurality of bit lines and the one common source line CSL. In addition, the plurality of common source lines CSLs may be arranged in the 2D manner. Here, electrically the same voltage may be applied to the plurality of common source lines CSLs, or each of the plurality of common source lines CSLs may be electrically and independently controlled.

Each of the plurality of cell strings CSTRs may include ground select transistors GSTs connected to the common source line CSL, string select transistors SSTs connected to the bit lines BLs, and a plurality of memory cell transistors MCTs disposed between the ground select transistors GSTs and the string select transistors SSTs. In addition, the ground select transistor GST, the string select transistor SST, and the memory cell transistors MCTs may be connected in series.

The common source line CSL may be commonly connected to sources of the ground select transistors GSTs. Further, the ground select lines GSLs, the ground select lines GSLs, the plurality of word lines WL0 to WL3, and the plurality of string select lines SSLs, which are disposed between the common source line CSL and the bit lines BLs, may be used as gate electrodes of the ground select transistors GSTs, the memory cell transistors MCTs and the string select transistors SSTs. In addition, the memory cell transistors MCTs may include data storage elements, respectively.

Referring to FIG. 3, the common source line CSL may be an impurity region formed in a conductive film formed on the substrate 10 or in the substrate 10. The plurality of bit lines BLs may be conductive patterns (e.g., metal lines) spaced apart from the substrate 10 and disposed on the substrate 10. The plurality of bit lines BLs are arranged in a 2 dimensional manner and a plurality of cell strings CSTRs are connected to the plurality of bit lines BLs, respectively. Accordingly, the cell strings CSTRs are arranged on the common source line CSL or the substrate 10 in a 2 dimensional manner.

The cell strings CSTRs may include a plurality of ground select lines GSL1 and GLS2, a plurality of word lines WL0 to WL3 and a plurality of string select lines SSL1 and SSL2, disposed between the common source line CSL and the bit lines BLs. The plurality of string select lines SSL1 and SSL2 may constitute the string select line SSL shown in FIG. 2, and the plurality of ground select lines GSL1 and GLS2 may constitute the ground select line GSL shown in FIG. 2. In addition, the ground select lines GSL1 and GSL2, the word lines WL0 to WL3 and the string select lines SSL1 and SSL2 may be conductive patterns stacked on the substrate 10.

In addition, each of the cell strings CSTRs may include a channel structure (or a vertical semiconductor pattern PL) vertically extending from the common source line CSL to then be connected to each of the bit lines BLs. The channel structures PLs may be formed to pass through the ground select lines GSL1 and GSL2, the word lines WL0 to WL3 and the string select lines SSL1 and SSL2. That is to say, the channel structures PLs may pass through the plurality of conductive patterns stacked on the substrate 10. In addition, each of the channel structures PLs may include a body part B and semiconductor pads (i.e., impurity regions D) formed at one or opposite ends of the body part B. For example, the semiconductor pads D may be formed at top ends of the channel structures PLs (i.e., between the body part B and the bit lines BLs).

A data storage film (DS) may be disposed between the word lines WL0 to WL3 and the channel structures PLs. The data storage film (DS) may be a charge storage film. For example, the data storage film (DS) may be one of a trap insulation film, floating gate electrodes, or an insulation film including conductive nano dots.

A dielectric film used as a gate insulation film of a transistor may be disposed between the ground select lines GSL1 and GSL2 and the channel structures PLs or between the string select lines SSL1 and SSL2 and the channel structures PLs. Here, the dielectric film may be formed of the same material as the data storage film DS and may be a gate insulation film (e.g., a silicon oxide film) for use in a general MOSFET.

With this structure, the channel structures PLs, together with the ground select lines GSL1 and GSL2, the word lines WL0 to WL3 and the string select lines SSL1 and SSL2, may constitute a MOSFET using the channel structures PL as channel regions. Alternatively, the channel structures PLs, together with the ground select lines GSL1 and GSL2, the word lines WL0 to WL3 and the string select lines SSL1 and SSL2, may constitute a MOS capacitor.

The ground select lines GSL1 and GSL2, the word lines WL0 to WL3 and the string select lines SSL1 and SSL2 may be used as gate electrodes of a select transistor and a cell transistor. In addition, inversion regions may be formed in the channel structures PLs by fringe fields generated from voltages applied to the ground select lines GSL1 and GSL2, the word lines WL0 to WL3 and the string select lines SSL1 and SSL2. Here, maximum distances (or widths) of the inversion regions may be greater than thicknesses of the word lines or select lines used in generating the inversion regions. Accordingly, the inversion regions generated in the channel structures PLs vertically overlap with each other, thereby forming a current passage for electrically connecting the common source line CSL and a selected bit line. That is to say, the cell strings CSTRs may be constructed such that ground and string transistors formed by the ground and string select lines GSL1, GSL2, SSL1 and SSL2 and memory cell transistors (MCTs of FIG. 2) formed by the word lines WL0 to WL3 are connected to each other in series.

Figure 4:
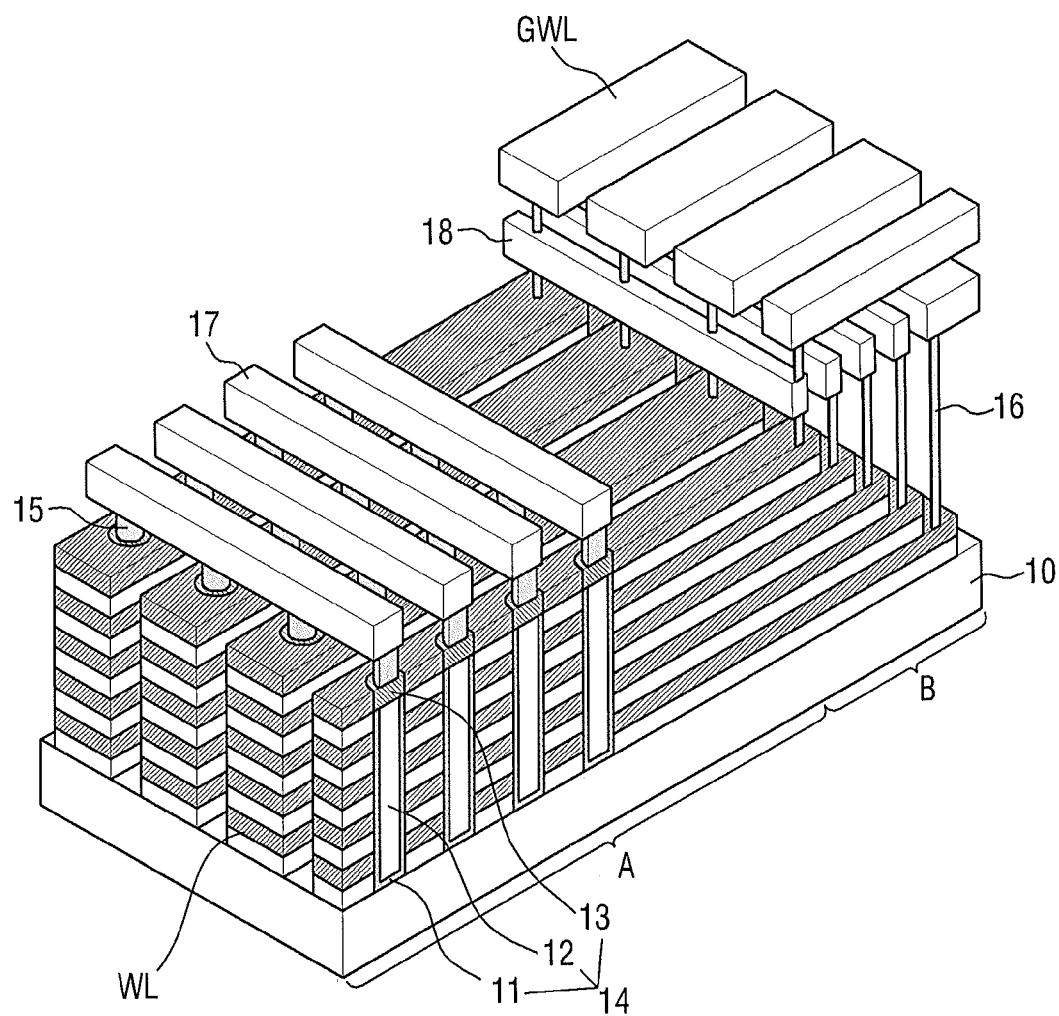
FIG. 4 is a perspective view illustrating a cell array region and a connection region of the 3D semiconductor memory device shown in FIG. 1.

FIG. 4 is a perspective view illustrating a cell array region and a connection region of the 3D semiconductor memory device shown in FIG. 1.

Referring to FIG. 4, word line (WL) structures including conductive patterns are arranged on the substrate 10 having the cell array region A and the connection region B defined therein. Channel structures 14 passing through the word line (WL) structures are arranged on the substrate 10 in the 2D manner. Data storage devices may be provided between the word line (WL) structures and the channel structures 14. In a case of a flash memory device, the data storage devices may include charge storage devices. Alternatively, the data storage devices may further include a tunnel insulation film formed between the charge storage film and the channel structure 14 and a blocking insulation film formed between the charge storage film and the conductive patterns.

Wire structures each including a first contact plug 15, a bit line 17, a second contact plug 16 and a connection wire 18, may be disposed on the word line (WL) structures. The bit lines 17 connected to the channel structures 14 through the first contact plugs 15 may be formed to traverse the word line (WL) structures. Connection wires 18 connected to the conductive patterns through the second contact plug 16 may electrically connect the conductive patterns equally spaced from the top surface of the substrate 10. Here, the number of conductive patterns connected to one connection wire 18 may vary in various manners in consideration of the design rule, product size and product characteristics in program/erase/read operations. Upper wires GWLs electrically connecting the connection wire 18 to peripheral circuits may be arranged on the connection wire 18.

Meanwhile, some of the conductive patterns (for example, a topmost conductive pattern and a bottommost conductive pattern) may be used as gate electrodes of the ground and string select transistors GST and SST shown in FIG. 2. That is to say, in a 3D NAND flash memory, the topmost conductive pattern may be used as a gate electrode of the string select transistor SST controlling electrical connection between the bit line 17 and the channel structure 14, and the bottommost conductive pattern may be used as a gate electrode of the ground select transistor GST controlling electrical connection between the common source line CSL and the channel structure 14.

Figure 5:
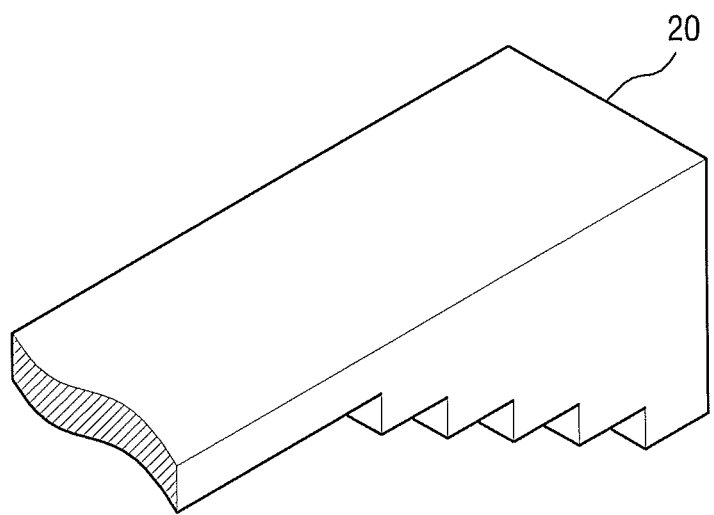
FIG. 5 is a perspective view illustrating an imprinting template in a method of fabricating a semiconductor device according to an embodiment of the present inventive concept.
Figure 6:
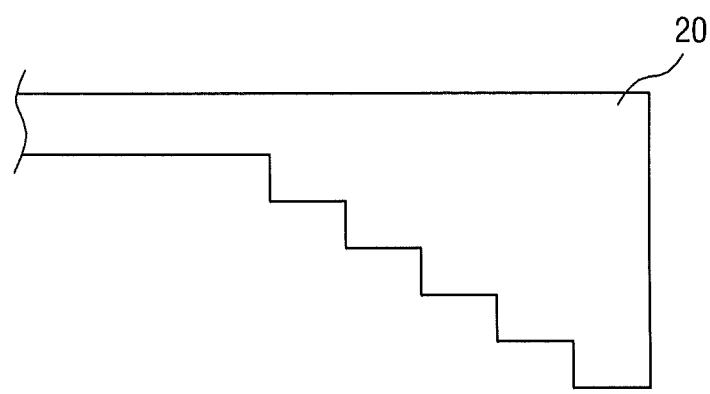
FIG. 6 is a cross-sectional view illustrating the imprinting template in the method of fabricating a semiconductor device shown in FIG. 5.

FIG. 5 is a perspective view illustrating an imprinting template in a method of fabricating a semiconductor device according to an embodiment of the present inventive concept and FIG. 6 is a cross-sectional view illustrating the imprinting template in the method of fabricating a semiconductor device shown in FIG. 5.

Referring to FIGS. 5 and 6, a three dimensional (3D) stair type structure is formed in intaglio in the template 20. The 3D stair type structure may include 3 or more layers. The 3D stair type patterns may have stairs having constant heights and widths, but aspects of the present inventive concept are not limited thereto. In order to form the 3D stair type patterns through one cycle of process in forming an imprint pattern 30 (FIG. 7) for nano imprinting process using the template 20, the template 20 is formed having the 3D stair type structure formed in intaglio. According to the increasing integration level of semiconductor devices in the NAND flash memory device, a plurality of gate patterns may be vertically formed. However, in order to form the plurality of gate patterns using one cycle of nano imprinting process while reducing the number of photography processes performed for forming the plurality of gate patterns, the template 20 is formed with the 3D stair type structure formed in intaglio. The plurality of gate patterns are formed using one cycle of nano imprinting process, thereby reducing the number of process steps and the fabrication cost and controlling an overlay of the plurality of gate patterns to be uniform.

The template 20 may be formed using a glass or quartz substrate capable of transmitting ultraviolet (UV) rays. The template 20 is formed in the following manner. A polymer P for forming a mold is coated on the substrate as a base of the template 20, and a stamp having a 3D stair type structure formed in relief is pressed. After the stamp is pressed, UV rays are irradiated. In this case, a polymer resin cured by UV rays is used as the molding polymer P. Therefore, when the UV rays are irradiated, the UV rays transmitted through the stamp reaches the molding polymer P, so that the molding polymer P is cured. After the stamp is removed, the template 20 having the 3D stair type structure formed in intaglio is completed.

Hereinafter, a method of fabricating a semiconductor device according to an embodiment of the present inventive concept will be described with reference to FIGS. 5 to 11.

FIGS. 7 to 11 illustrate intermediate process steps in a method of fabricating a semiconductor device according to an embodiment of the present inventive concept.

Figure 7:
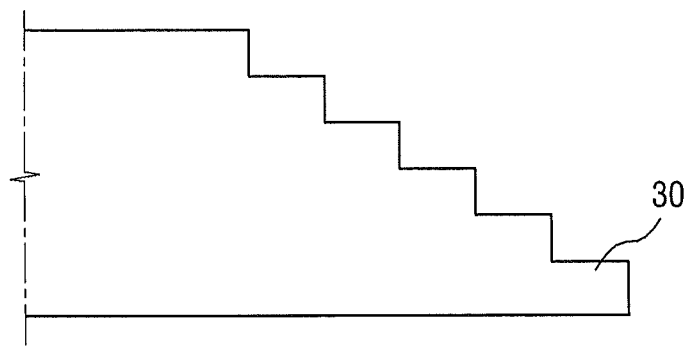
FIGS. 7 to 11 illustrate intermediate process steps in a method of fabricating a semiconductor device according to an embodiment of the present inventive concept.

Referring first to FIGS. 5 to 7, the template 20 having the 3D stair type structure formed in intaglio is prepared. An imprint pattern 30 having a 3D stair type structure is formed using the template 20.

The imprint pattern 30 is formed by coating a resin layer on a substrate 10 where a plurality of gate pads are to be formed, and then pressing the template 20. Like the molding polymer P used to form the template 20, a polymer resin cured by UV rays is used as the resin layer. Here, in order to prevent adhesion from occurring between the template 20 and the resin layer, the molding polymer P used for forming the template 20 and the resin layer may be formed using different materials, and an anti-adhesion layer for obtaining a releasing property of the template 20 may be coated on the resin layer. After the template 20 is placed on the resin layer and then pressed, UV rays are irradiated to cure the resin layer, thereby forming the imprint pattern 30.

Referring to FIGS. 8 to 11, stair type patterns are simultaneously formed on the substrate 10 using the imprint pattern 30.

Figure 8:
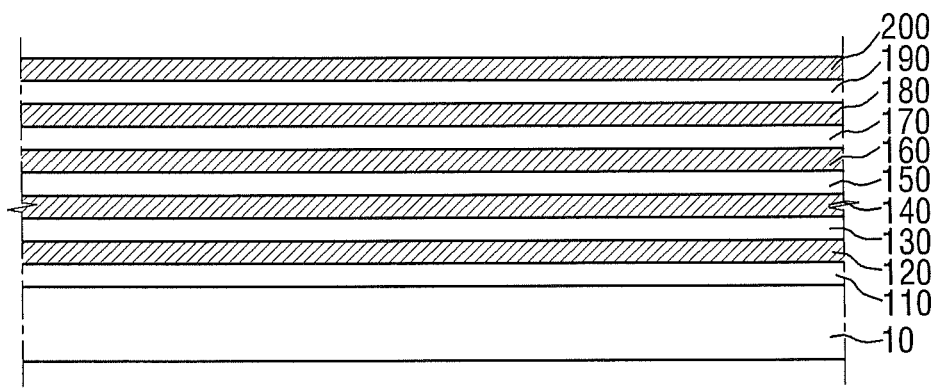
Figure 9:
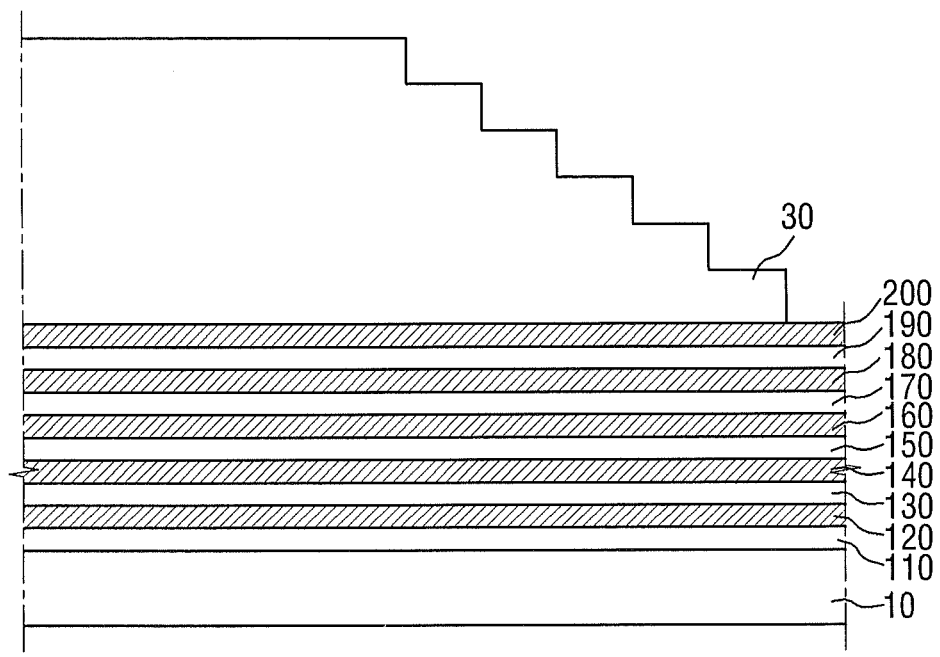

Insulation films 110, 130, 150, 170 and 190 and conductive films 120, 140, 160, 180 and 200 are alternately stacked on the substrate 10 to form the plurality of gate pads (see FIG. 8). The forming of the imprint pattern 30 may be completed by coating a resin layer on the substrate 10 having the insulation films 110, 130, 150, 170 and 190 and the conductive films 120, 140, 160, 180 and 200 alternately stacked thereon, placing the template 20 on the resin layer and pressing, followed by irradiating UV rays and curing the resin layer (see FIG. 9).

Figure 10:
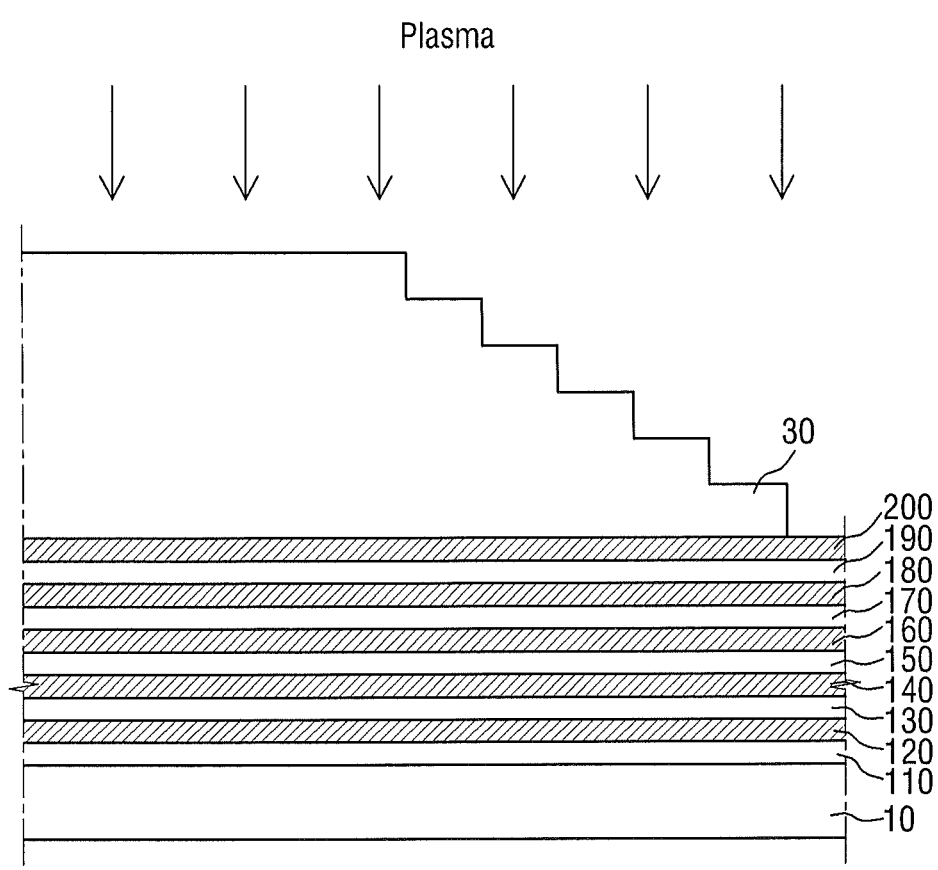
Figure 11:
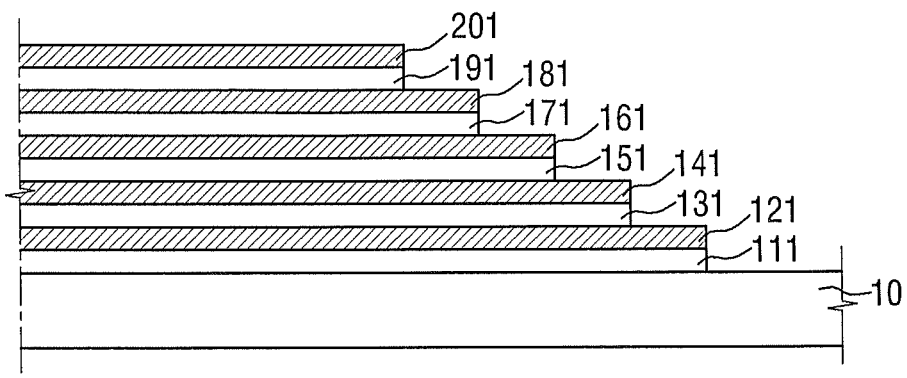

Next, referring to FIGS. 10 and 11, the stair type patterns are simultaneously formed on the substrate 10 by dry etching. Here, the dry etching may be performed by plasma etching. Plasma ions are accelerated toward the imprint pattern 30, and the insulation films 110, 130, 150, 170 and 190 and the conductive films 120, 140, 160, 180 and 200 formed on the substrate 10 are etched by the plasma ions transmitted through the imprint pattern 30. Here, the imprint pattern 30 functions as an etching barrier, and the etching is performed on the insulation films 110, 130, 150, 170 and 190 and the conductive films 120, 140, 160, 180 and 200 only to a predetermined depth, thereby forming the insulation film patterns 111, 131, 151, 171 and 191 and the conductive film patterns 121, 141, 161, 181 and 201 having stair type patterns on the substrate 10. In the stair type patterns, each of the insulation film patterns 111, 131, 151, 171 and 191 and the conductive film patterns 121, 141, 161, 181 and 201 are included in a single layer, thereby forming a stair layer (for example, the insulation film pattern 111 and the conductive film pattern 121).

Hereinafter, a method of fabricating a semiconductor device according to another embodiment of the present inventive concept will be described with reference to FIGS. 5, 6, and 12 to 19. For the sake of convenient explanation, substantially the same content as that of the method of fabricating a semiconductor device according to an embodiment of the present inventive concept will be omitted.

FIGS. 12 to 19 illustrate intermediate process steps in a method of fabricating a semiconductor device according to another embodiment of the present inventive concept.

Referring to FIGS. 5 and 6, the template 20 having the 3D stair type structure formed in intaglio is prepared. Here, the 3D stair type structure formed on the template 20 includes first to nth layers, where n is an integer greater than or equal to 3. That is to say, the 3D stair type structure may include 3 or more layers. The first to nth layers may have constant height and width, but aspects of the present inventive concept are not limited thereto.

Figure 12:
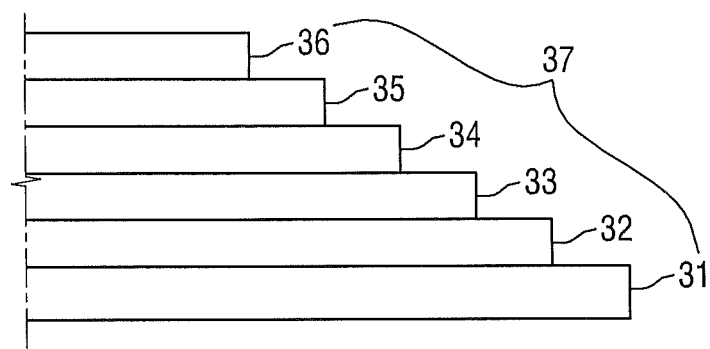
FIGS. 12 to 19 illustrate intermediate process steps in a method of fabricating a semiconductor device according to another embodiment of the present inventive concept.

Referring to FIG. 12, imprint pattern 37 having the 3D stair type structure is formed using the template 20. Here, the imprint pattern 37 includes a plurality of layers (e.g., 31 to 36).

Figure 13:
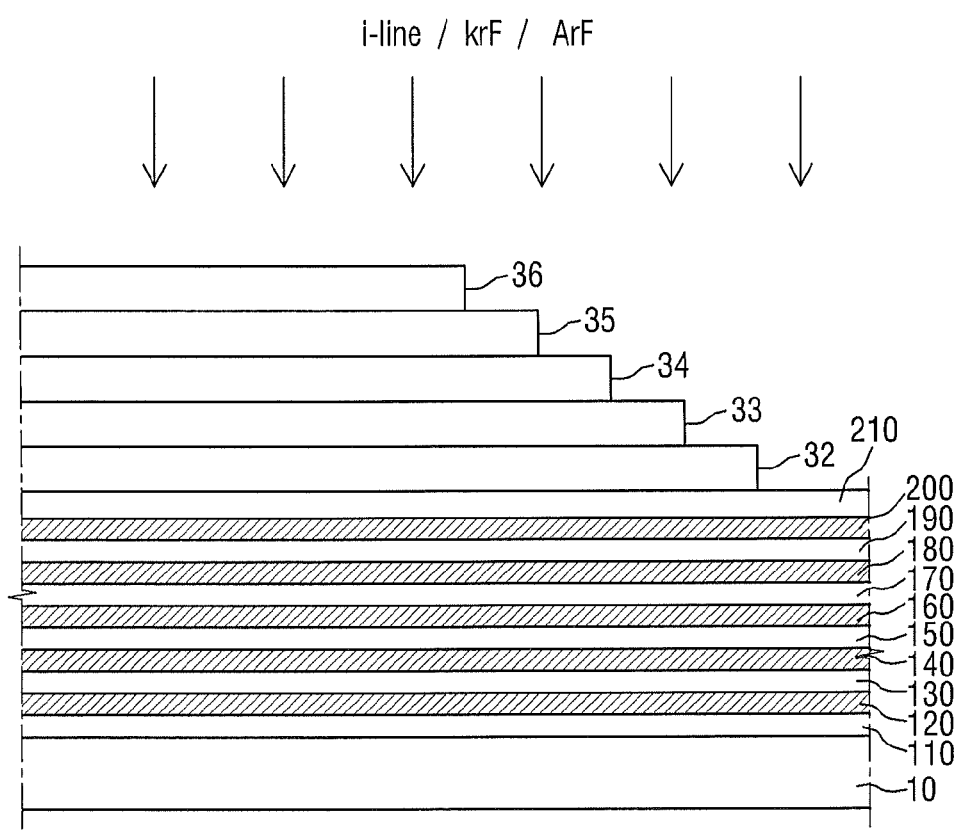
Figure 14:
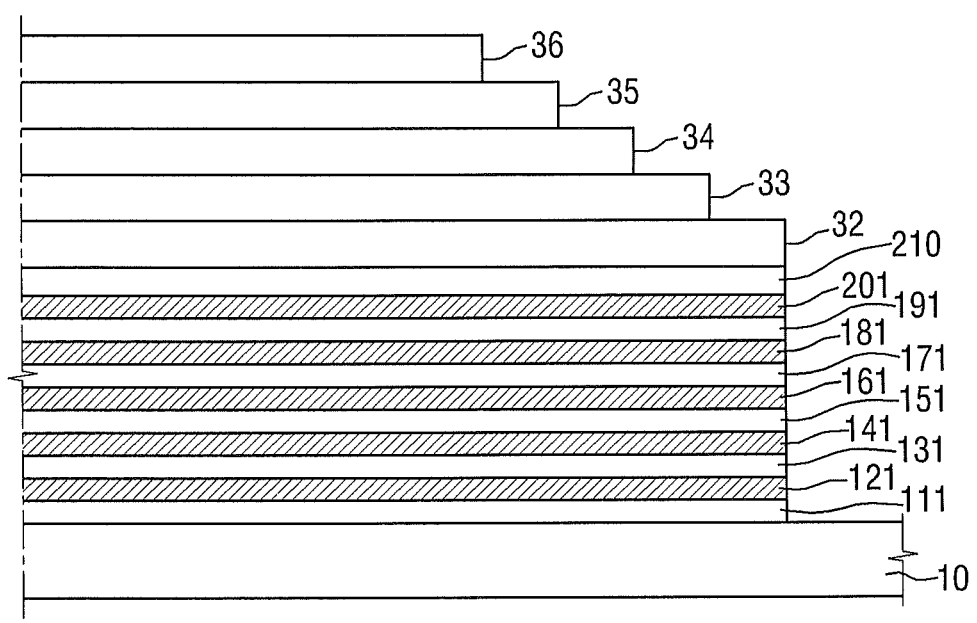

Referring to FIGS. 13 and 14, the insulation films 110, 130, 150, 170 and 190 and the conductive films 120, 140, 160, 180 and 200 for forming the plurality of gate pads are alternately stacked on the substrate 10. In addition, a photoresist layer 210 is further formed on the topmost conductive film 200. The imprint pattern 37 is placed on the photoresist layer 210, and the insulation films 110, 130, 150, 170 and 190 and the conductive films 120, 140, 160, 180 and 200, except for the substrate 10, are etched by photolithography using the imprint pattern 37 as a mask, thereby forming a first layer (e.g., the substrate 10). In the photolithography, light having a wavelength of i-line (365 nm), KrF (248 nm), or ArF (193 nm) may be used.

Figure 15:
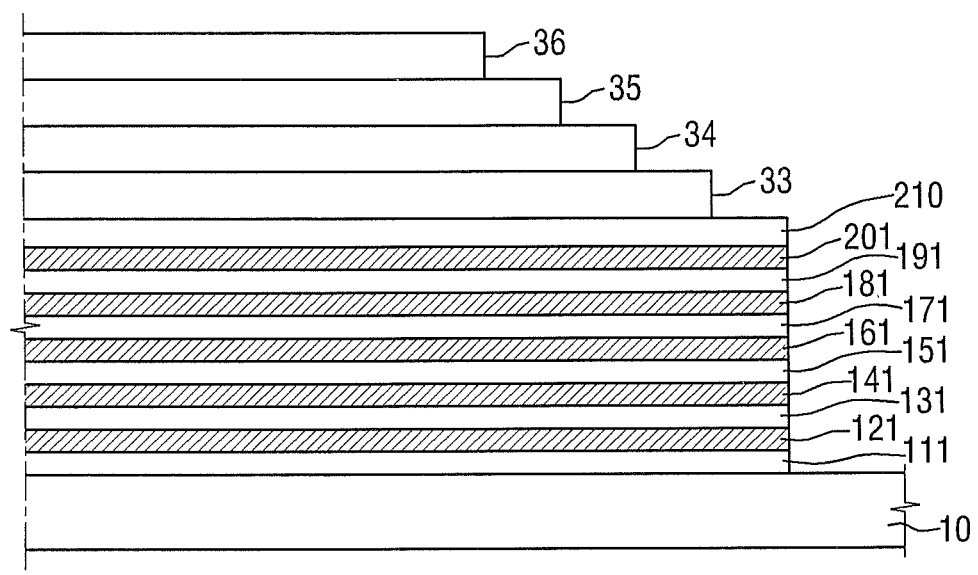
Figure 16:
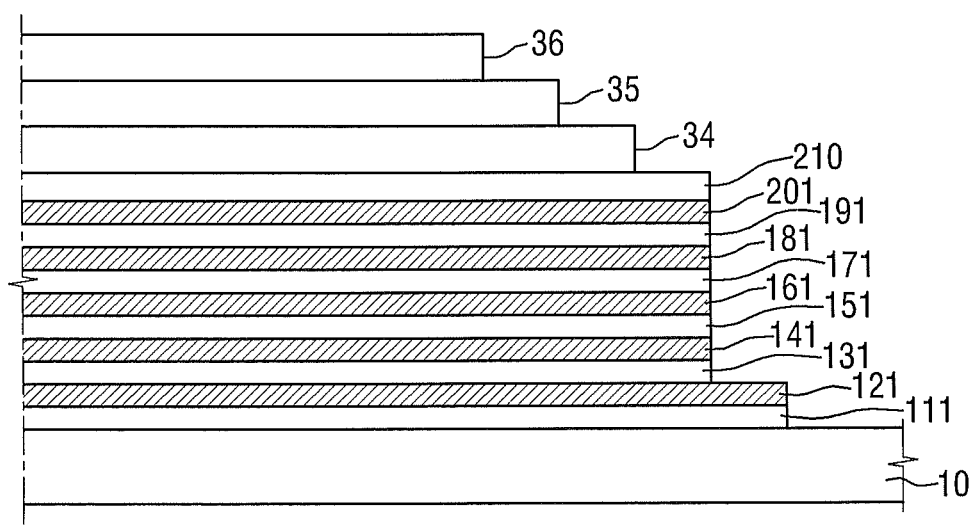

Referring to FIGS. 15 and 16, a lower layer of the imprint pattern 37 is removed from the substrate 10 having the insulation film patterns 111, 131, 151, 171 and 191 and the conductive film patterns 121, 141, 161, 181 and 201, and a second layer (e.g., the insulation film pattern 111 and the conductive film pattern 121) is formed on the substrate 10 using the imprint pattern 37 as a mask.

Figure 17:
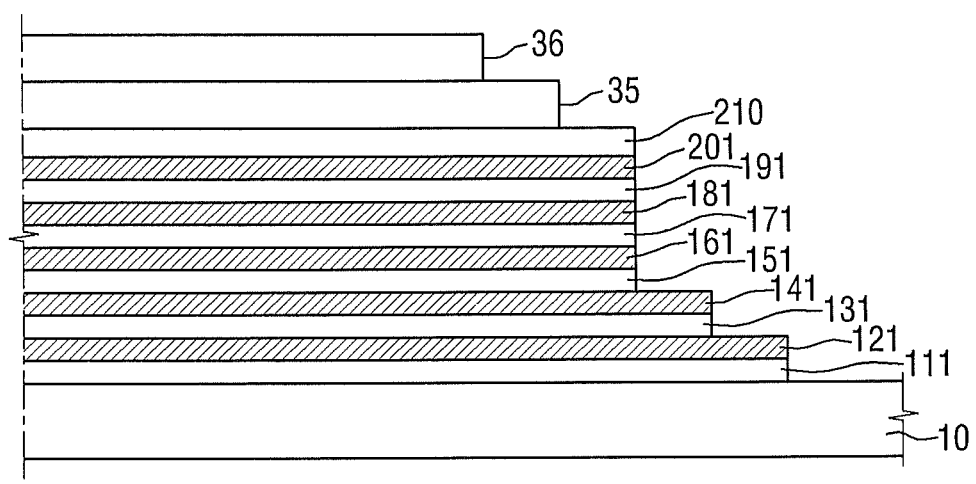
Figure 18:
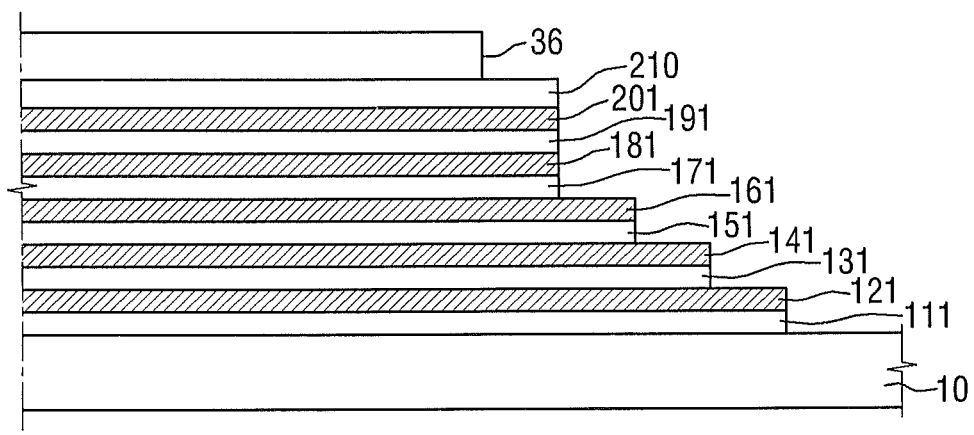
Figure 19:
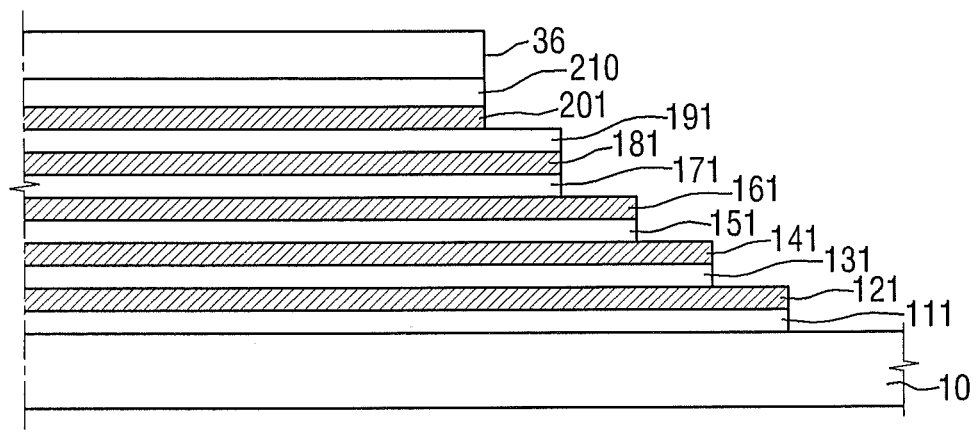

Referring to FIGS. 17 to 19, sequentially removing the lower layer of the imprint pattern 37 and using the imprint pattern 37 as a mask are repeatedly performed. While repeating the above-described procedure, the third to nth layers are sequentially formed on the substrate 10 using photolithography. The third layer may include, for example, the insulation film pattern 131 and the conductive film pattern 141.

Figure 20:
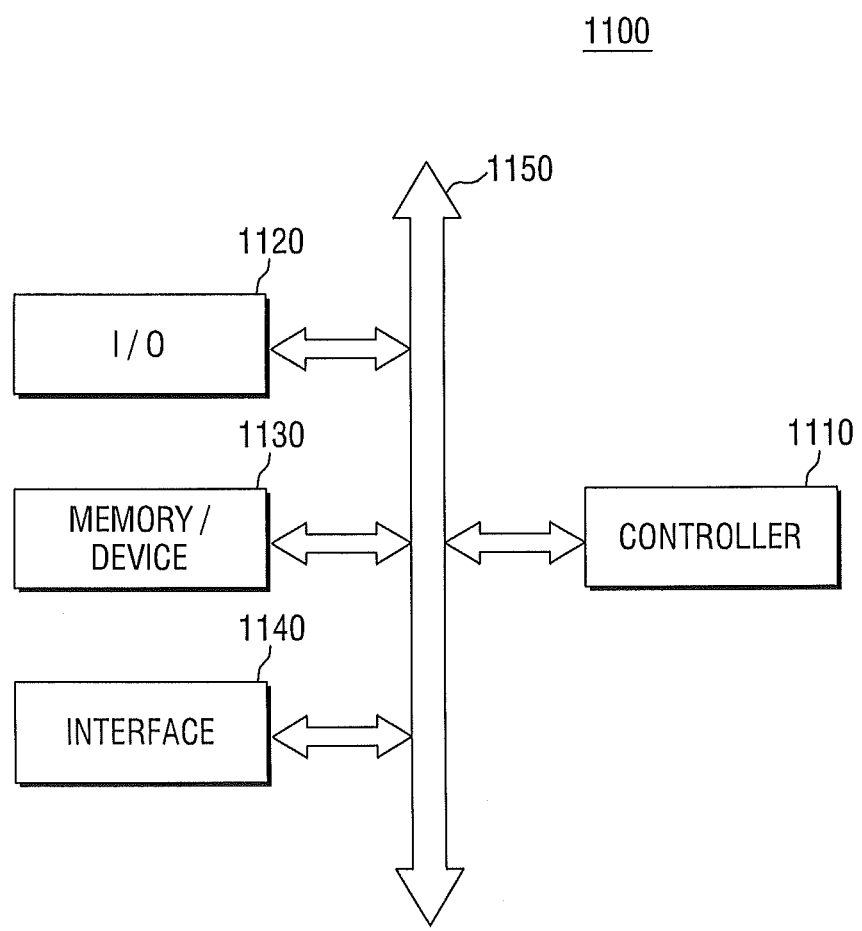
FIG. 20 is a schematic block diagram illustrating a system including a nonvolatile memory device manufactured according to some embodiments of the present inventive concept.

FIG. 20 is a schematic block diagram illustrating a system including a nonvolatile memory device manufactured according to some embodiments of the present inventive concept.

Referring to FIG. 20, the system 1100 may be applied to a personal digital assistant (PDA), a portable computer, a web tablet, a wireless phone, a mobile phone, a digital music player, a memory card, or any type of electronic device capable of transmitting and/or receiving information in a wireless environment.

The system 1100 may include a controller 1110, an input/output device (I/O) 1120, such as a keypad, a keyboard, a display, and the like, a memory device 1130, an interface 1140 and a bus 1150. The memory device 1130 and the interface 1140 may be connected to each other through the bus 1150.

The controller 1110 may include at least one of a microprocessor, a digital signal processor, a microcontroller, and logic elements capable of functions similar to those of these elements. The memory device 1130 may store commands executed by the controller 1110. The I/O 1120 may receive data or signals from the outside of the system 1100 or may output data or signals to the outside of the system 1100. The I/O 1120 may include, for example, a keypad, a keyboard, a display device, and so on.

The memory 1130 includes a nonvolatile memory device fabricated according to some embodiments of the present inventive concept. The memory 1130 may further include other types of memories, volatile memories accessible at any time, and a variety of other types of memories.

The interface 1140 may perform functions of transmitting data to a communication network or receiving data from the communication network.

Figure 21:
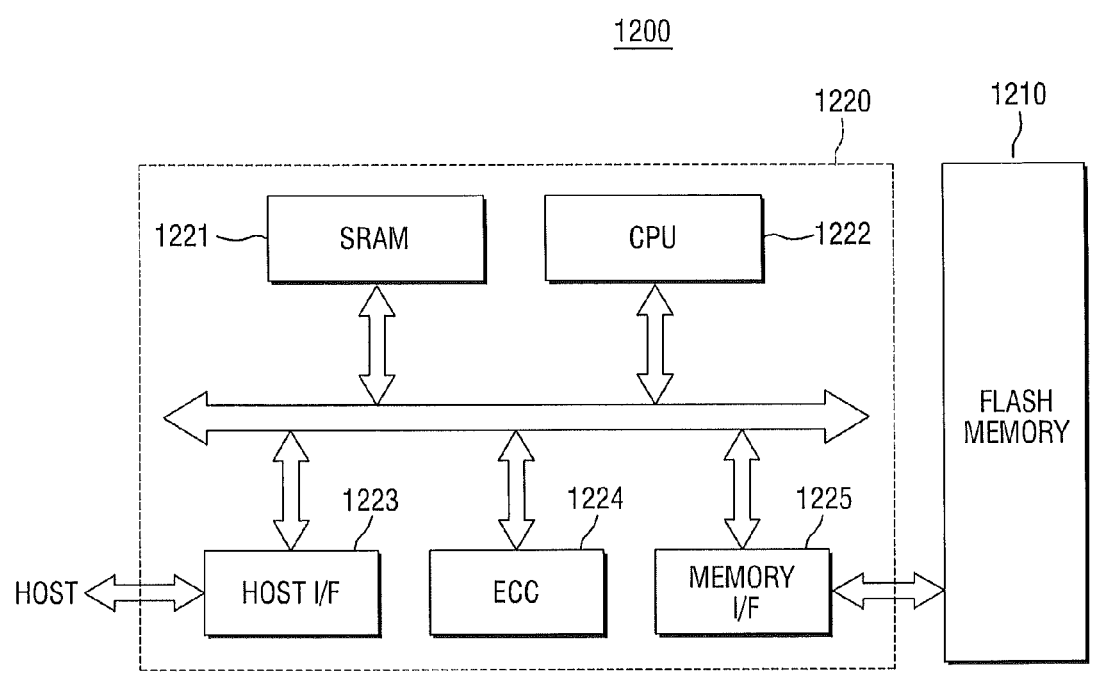
FIG. 21 is a schematic block diagram illustrating a memory card including a nonvolatile memory device manufactured according to some embodiments of the present inventive concept.

FIG. 21 is a schematic block diagram illustrating a memory card including a nonvolatile memory device manufactured according to some embodiments of the present inventive concept.

Referring to FIG. 21, a memory card 1200 for supporting high-capacity data storage capability includes a flash memory device 1210 fabricated according to some embodiments of the present inventive concept. The memory card 1200 fabricated according to some embodiments of the present inventive concept includes a memory controller 1220 controlling data exchange between a host and the flash memory device 1210.

A static random access memory (SRAM) 1221 is used as a working memory of a processing unit 1222. A host interface 1223 includes a data exchange protocol of the host connected to the memory card 1200. An error correction block 1224 detects and corrects an error included in data read from the multi-bit flash memory device 1210. The memory interface 1225 interfaces with the flash memory device 1210 according to the present inventive concept. The processing unit 1222 performs an overall controlling operation for data exchange of the memory controller 1220. It is obvious to one skilled in the art that the memory card 1200 fabricated according to some embodiments of the present inventive concept may further include a read only memory (ROM) storing code data for interfacing with the host.

Figure 22:
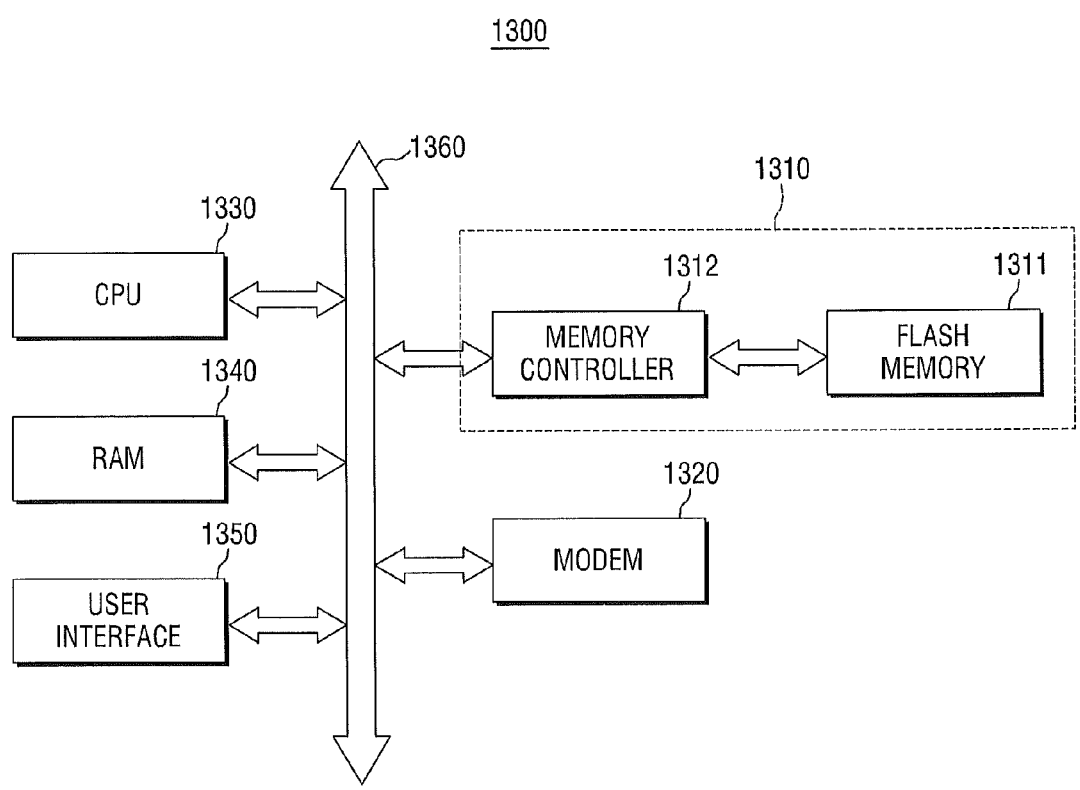
FIG. 22 is a schematic block diagram illustrating an information processing system including a nonvolatile memory device manufactured according to some embodiments of the present inventive concept.

FIG. 22 is a schematic block diagram illustrating an information processing system including a nonvolatile memory device manufactured according to some embodiments of the present inventive concept.

Referring to FIG. 22, a flash memory system 1310 according to embodiments of the present inventive concept is built in an information processing system 1300 such as a mobile product or a desktop computer. The information processing system 1300 in accordance with the present inventive concept includes the flash memory system 1310 and a modem 1320, a central processing unit (CPU) 1330, a random access memory (RAM) 1340, and a user interface 1350 that are electrically connected to a system bus 1360, respectively. The flash memory system 1310 may be with the same as or substantially similar to the memory system or the flash memory system described above. The flash memory system 1310 stores data processed by the central processing unit 1330 or data received from an external device. Here, the flash memory system 1310 may comprise a solid state disk (SSD) and, in this case, the data processing system 1310 can stably store large amounts of data in the flash memory system 1310. As reliability increases, the flash memory system 1310 can reduce resources used to correct errors, thereby providing a high speed data exchange function to the information processing system 1300. Although not illustrated in the drawing, it is apparent to one of ordinary skill in the art that the information processing unit 1300 in accordance with embodiments of the present inventive concept may further include an application chipset, a camera image processor (CIS) and/or an input/output device.

In addition, the flash memory device or the memory system in accordance with some embodiments of the present inventive concept can be mounted with various types of packages. For example, the flash memory device or the memory system can be mounted by various types of packages such as, but not limited to, PoP (package on package), ball grid array (BGA), chip scale package (CSP), plastic leaded chip carrier (PLCC), plastic dual in-line package (PDIP), die in waffle pack, die in wafer form, chip on board (COB), ceramic dual in-line package (CERDIP), plastic metric quad flat pack (MQFP), thin quad flat pack (TQFP), small outline (SOIC), shrink small outline package (SSOP), thin small outline (TSOP), system in package (SIP), multi chip package (MCP), wafer-level fabricated package (WFP), wafer-level processed stack package (WSP) and mounted.

While the present inventive concept has been particularly shown and described with reference to exemplary embodiments thereof, it will be understood by those of ordinary skill in the art that various changes in form and details may be made therein without departing from the spirit and scope of the present inventive concept as defined by the following claims. It is therefore desired that the present embodiments be considered in all respects as illustrative and not restrictive, reference being made to the appended claims rather than the foregoing description to indicate the scope of the inventive concept.

What is claimed is:

1. A method of fabricating a semiconductor device, the method comprising:
   preparing a template having a three dimensional (3D) stair type structure formed in intaglio;
   forming an imprint pattern having the stair type structure using the template; and
   simultaneously forming a stair type pattern on a substrate using the imprint pattern.

2. The method of claim 1, wherein forming the imprint pattern comprises using a nano-imprint process.

3. The method of claim 1, wherein forming the stair type pattern on the substrate comprises using a dry etching process.

4. The method of claim 3, wherein the dry etching process is a plasma etching process.

5. The method of claim 1, wherein the stair type structure includes three or more layers.

6. The method of claim 1, wherein the stair type pattern comprises stairs having constant heights and widths.

7. The method of claim 1, wherein the substrate has an insulation film and a conductive film alternately stacked.

8. The method of claim 7, wherein the stair type pattern comprises the insulation film and the conductive film in each layer.

9. A method of fabricating a semiconductor device, the method comprising:
   preparing a template having a three dimensional (3D) stair type structure formed in intaglio, the stair type structure including first to nth layers;
   forming an imprint pattern having the stair type structure using the template;

forming a first layer on the substrate using the imprint pattern as a mask;

forming a second layer on the substrate using the imprint pattern as a mask after removing the first layer of the imprint pattern; and sequentially forming the third to nth layers on the substrate by sequentially removing the second to nth layers of the imprint pattern using the imprint pattern as a mask.

10. The method of claim 9, wherein forming the imprint pattern is performed using a nano-imprint process.

11. The method of claim 9, wherein forming the first to nth layers on the substrate comprises using photolithography.

12. The method of claim 9, wherein the stair type structure includes three or more layers.

13. The method of claim 9, wherein the first to nth layers formed on the substrate have constant heights and widths.

14. The method of claim 9, wherein the substrate has an insulation film and a conductive film alternately stacked.

15. The method of claim 14, wherein each layer of the first to nth layers comprises the insulation film and the conductive film.

16. A method of fabricating a semiconductor device, comprising:

forming an imprint pattern having a three dimensional (3D) stair type structure using a template that mirrors the 3D stair type structure, wherein the 3D stair type structure comprises at least three stairs of similar height and width; and forming a stair type pattern on a substrate using the imprint pattern, wherein each of the at least three stairs of the stair type pattern is formed simultaneously.

17. The method of claim 16, wherein forming the stair type pattern comprises forming the stair type pattern using one cycle of a nano-imprint process.

18. The method of claim 17, wherein forming the stair type pattern comprises plasma etching through the imprint pattern.

19. The method of claim 18, wherein the substrate has an insulation film and a conductive film alternately stacked, and wherein forming the stair type pattern comprises forming each of the at least three stairs of the stair type pattern similar in height to a combined height of a layer of the insulation film and an adjacent layer of the conductive film.

20. The method of claim 19, wherein forming the imprint pattern comprises pressing the template on anti-adhesion layer coated on a resin layer coated on an uppermost layer of the conductive film and curing the resin layer.

* * * * *